(12) United States Patent
Choi et al.

(10) Patent No.: US 11,216,131 B2
(45) Date of Patent: Jan. 4, 2022

(54) FILM TOUCH SENSOR AND MANUFACTURING METHOD THEREFOR

(71) Applicant: DONGWOO FINE-CHEM CO., LTD., Iksan-si (KR)

(72) Inventors: Yong Seok Choi, Jeonju-si (KR); Byung Muk Yu, Pyeongtaek-si (KR); Ju In Yoon, Pyeongtaek-si (KR); Seungjune Park, Seoul (KR); Min Hyuk Park, Gangneung-si (KR); Seonghwan Park, Hwaseong-si (KR); Euk Kun Yoon, Hwaseong-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 131 days.

(21) Appl. No.: 15/527,751

(22) PCT Filed: Nov. 17, 2015

(86) PCT No.: PCT/KR2015/012356
§ 371 (c)(1),
(2) Date: May 18, 2017

(87) PCT Pub. No.: WO2016/080738
PCT Pub. Date: May 26, 2016

(65) Prior Publication Data
US 2017/0329436 A1    Nov. 16, 2017

(30) Foreign Application Priority Data

Nov. 20, 2014 (KR) .................. 10-2014-0162892
Nov. 20, 2014 (KR) .................. 10-2014-0162967
(Continued)

(51) Int. Cl.
*G02F 1/1333* (2006.01)
*G06F 1/16* (2006.01)
(Continued)

(52) U.S. Cl.
CPC .......... *G06F 3/0445* (2019.05); *G02F 1/1343* (2013.01); *G02F 1/13338* (2013.01);
(Continued)

(58) Field of Classification Search
CPC .... G06F 3/0445; G06F 3/0443; G06F 3/0446; G06F 3/041; G06F 1/1652; G06F 3/0412;
(Continued)

(56) References Cited

U.S. PATENT DOCUMENTS 4,342,814 A * 8/1982 Usuki ................... H01B 3/006
                                                        174/120 C
4,958,148 A    9/1990 Olson
(Continued)

FOREIGN PATENT DOCUMENTS

CN    101057210    10/2007
CN    102279480    12/2011
(Continued)

OTHER PUBLICATIONS

International Searching Authority, International Search Report of PCT/KR2015/012356, dated Mar. 10, 2016. [PCT/ISA/210].
(Continued)

*Primary Examiner* — Patrick N Edouard
*Assistant Examiner* — Douglas M Wilson
(74) *Attorney, Agent, or Firm* — Sughrue Mion, PLLC

(57) ABSTRACT

The present invention relates to a film touch sensor in which a separation layer is formed on a carrier substrate prior to the formation procedures of the touch sensor and an insulation layer is formed to be used as a planarization layer, an adhesive layer or a base layer, and a method of preparing the film touch sensor.

23 Claims, 8 Drawing Sheets

(30) Foreign Application Priority Data

Dec. 9, 2014 (KR) ........................ 10-2014-0176204
Dec. 9, 2014 (KR) ........................ 10-2014-0176206

(51) Int. Cl.
*G06F 3/041* (2006.01)
*G06F 3/044* (2006.01)
*G02F 1/1343* (2006.01)

(52) U.S. Cl.
CPC ...... *G02F 1/133305* (2013.01); *G06F 1/1652* (2013.01); *G06F 3/041* (2013.01); *G06F 3/0443* (2019.05); *G06F 3/0446* (2019.05)

(58) Field of Classification Search
CPC ........... G02F 1/133305; G02F 1/13338; G02F 1/1343
See application file for complete search history.

(56) References Cited

U.S. PATENT DOCUMENTS

| | | | | |
|---|---|---|---|---|
| RE38,466 E | * | 3/2004 | Inoue | ................ H01L 21/76251 |
| | | | | 438/30 |
| 8,182,633 B2 | | 5/2012 | Yoon et al. | |
| 8,236,125 B2 | | 8/2012 | Okabe | |
| 2002/0043889 A1 | * | 4/2002 | Inoue | ........................ H03H 3/08 |
| | | | | 310/313 B |
| 2003/0159773 A1 | | 8/2003 | Tonmiyama et al. | |
| 2007/0134459 A1 | * | 6/2007 | Hubert | ................... G02B 1/105 |
| | | | | 428/40.1 |
| 2009/0160819 A1 | | 6/2009 | Sasaki et al. | |
| 2009/0266471 A1 | | 10/2009 | Kim et al. | |
| 2010/0136868 A1 | | 6/2010 | Chien et al. | |
| 2010/0173167 A1 | * | 7/2010 | Vissing | ................... B05D 5/08 |
| | | | | 428/447 |
| 2010/0210055 A1 | | 8/2010 | Yoon et al. | |
| 2011/0030457 A1 | | 2/2011 | Valery et al. | |
| 2011/0101314 A1 | | 5/2011 | Kim | |
| 2011/0216029 A1 | | 9/2011 | Jin et al. | |
| 2012/0075207 A1 | | 3/2012 | Jang | |
| 2012/0299638 A1 | | 11/2012 | Han | |
| 2013/0063393 A1 | | 3/2013 | Kurishima et al. | |
| 2013/0168138 A1 | | 7/2013 | Yamazaki et al. | |
| 2013/0335344 A1 | * | 12/2013 | Han | ........................ G06F 3/047 |
| | | | | 345/173 |
| 2014/0000943 A1 | | 1/2014 | Kang et al. | |
| 2014/0209897 A1 | | 7/2014 | Kubota et al. | |
| 2015/0050758 A1 | | 2/2015 | Ko et al. | |
| 2015/0210048 A1 | * | 7/2015 | Jeong | ..................... H01L 31/18 |
| | | | | 428/212 |
| 2015/0255518 A1 | | 9/2015 | Watanabe et al. | |
| 2015/0257265 A1 | * | 9/2015 | Ullmann | ................. H05K 1/11 |
| | | | | 324/658 |
| 2016/0048229 A1 | * | 2/2016 | Chi | ....................... G06F 3/0443 |
| | | | | 345/173 |
| 2016/0291641 A1 | * | 10/2016 | Doyle | ................. H04M 1/0268 |

FOREIGN PATENT DOCUMENTS

| | | | | |
|---|---|---|---|---|
| CN | | 102782619 | 11/2012 | |
| CN | | 103080876 | 5/2013 | |
| CN | | 103383617 | 11/2013 | |
| KR | | 10-2007-0054661 A | 5/2007 | |
| KR | | 10-2011-0008453 A | 1/2011 | |
| KR | | 10-2012-0032735 A | 4/2012 | |
| KR | | 10-1191865 B1 | 10/2012 | |
| KR | | 10-1277546 B1 | 6/2013 | |
| KR | | 10-2014-0008607 A | 1/2014 | |
| KR | | 10-1372525 B1 | 3/2014 | |
| KR | | 10-2014-0131130 A | 11/2014 | |
| KR | | 10-2014-0137631 A | 12/2014 | |
| WO | | WO-2014129852 A1 | * | 8/2014 ........... G06F 3/0446 |

OTHER PUBLICATIONS

European Patent Office, Communication dated May 25, 2018 in Application No. EP 15 86 1616.
Chinese Patent Office, Communication dated May 13, 2019 in Application No. 201580063161.8.
International Search Report for PCT/KR2015/013192 dated Mar. 30, 2016 [PCT/ISA/210].
Written Opinion for PCT/KR2015/013192 dated Mar. 30, 2016 [PCT/ISA/237].

* cited by examiner

【Figure 1】
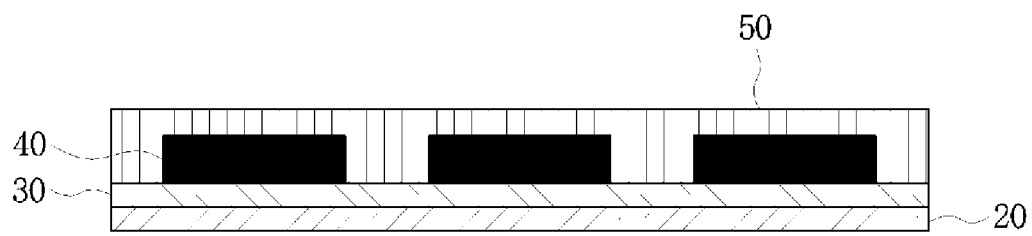
【Figure 2】
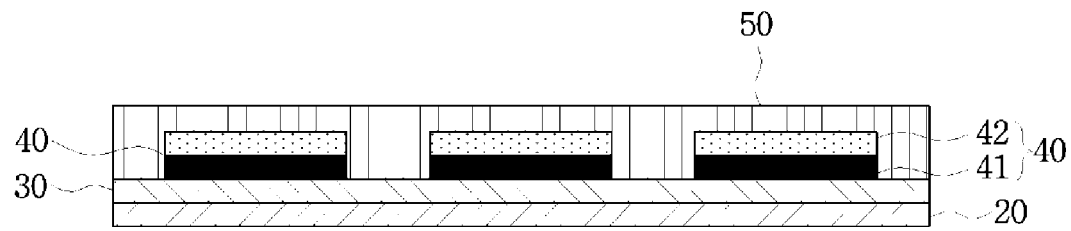
【Figure 3】
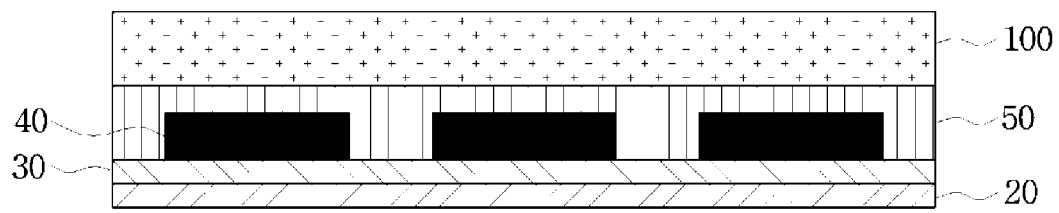
【Figure 4】
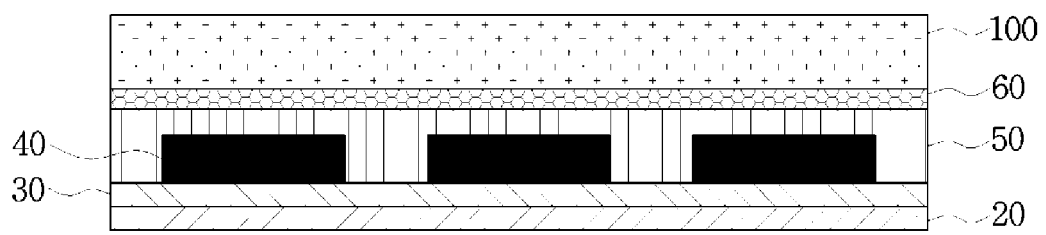

【Figure 5a】
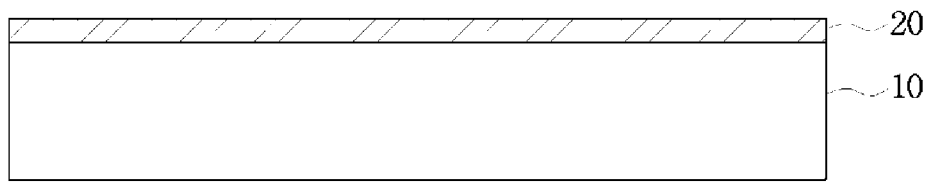
【Figure 5b】
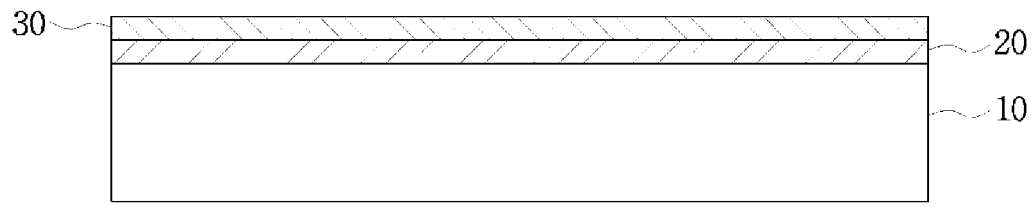
【Figure 5c】
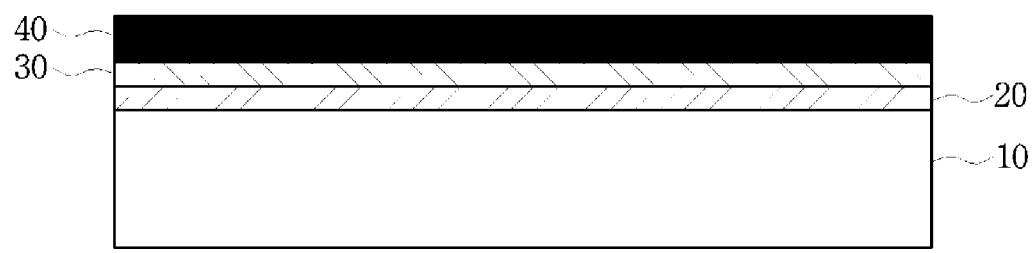
【Figure 5d】
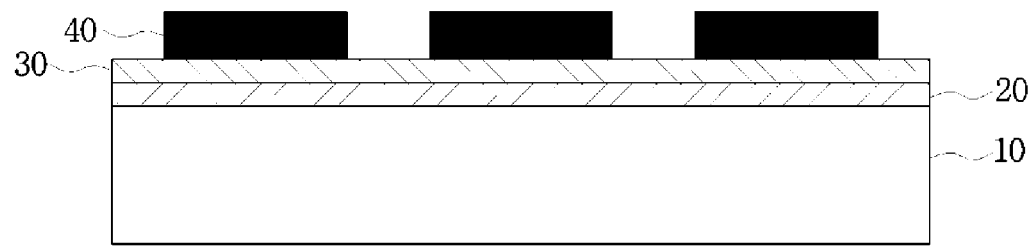

[Figure 5e]
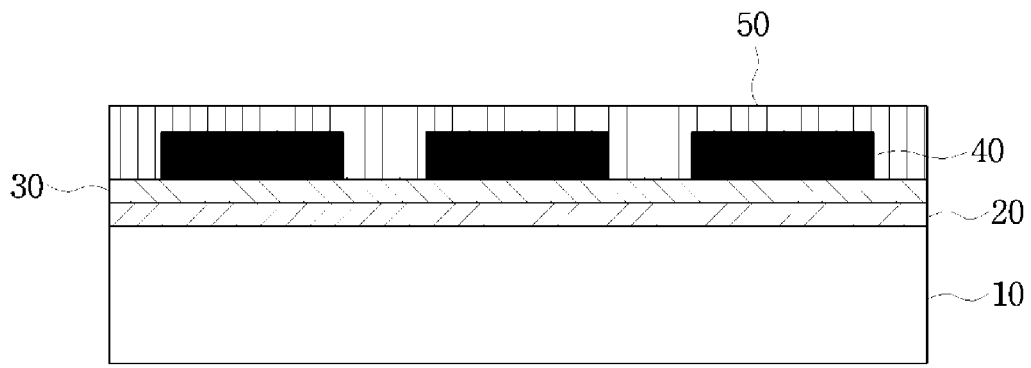
[Figure 5f]
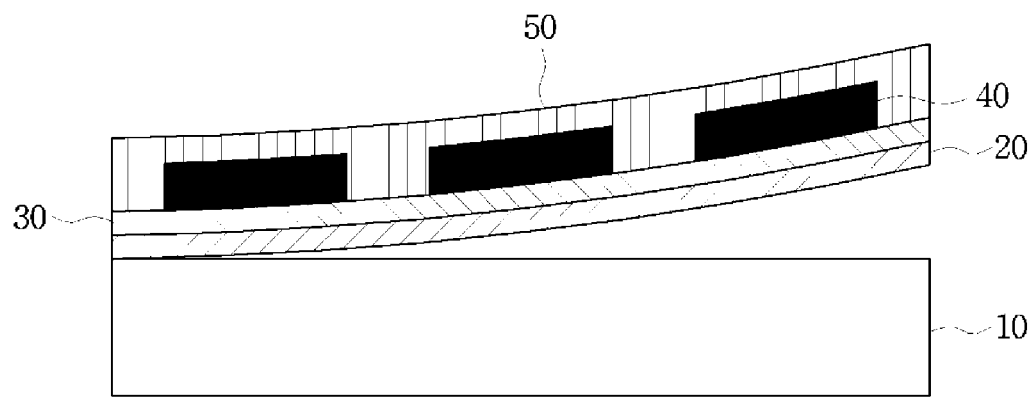
[Figure 6a]
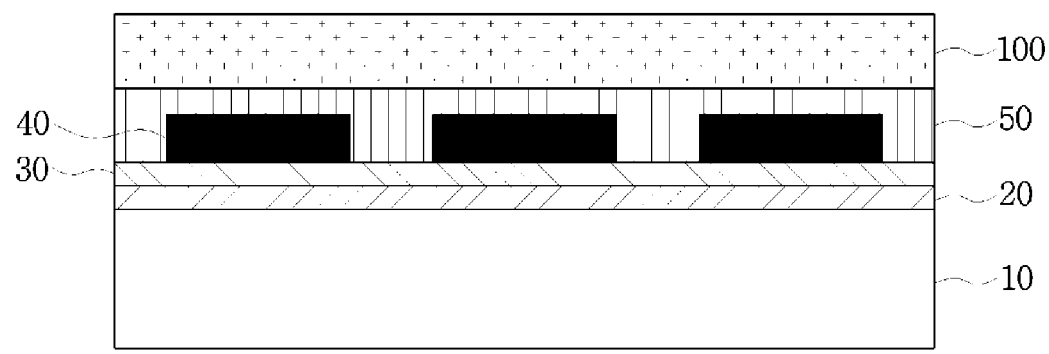

【Figure 6b】
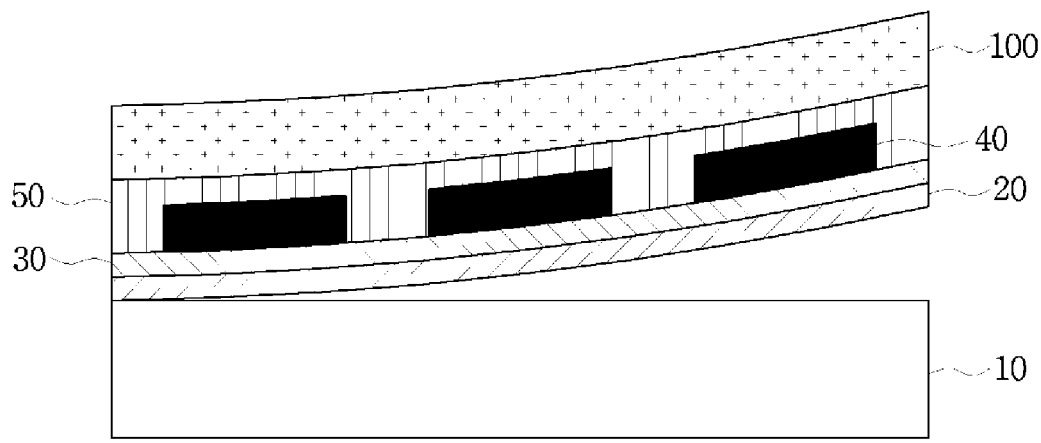
【Figure 7a】
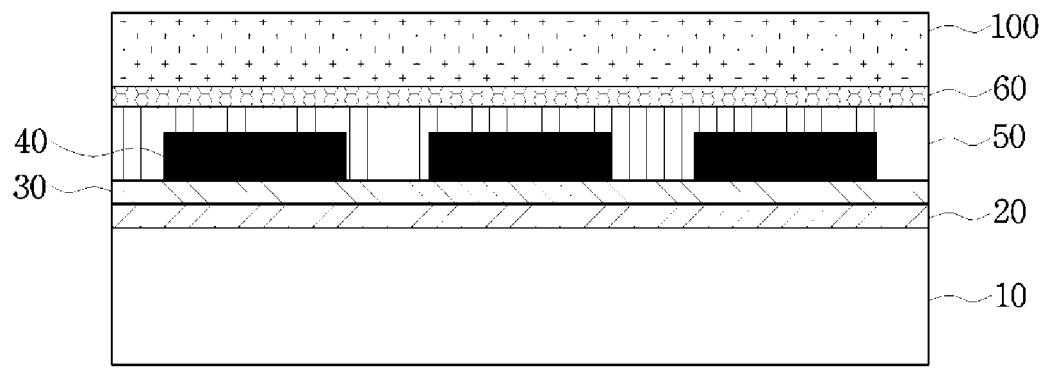
【Figure 7b】
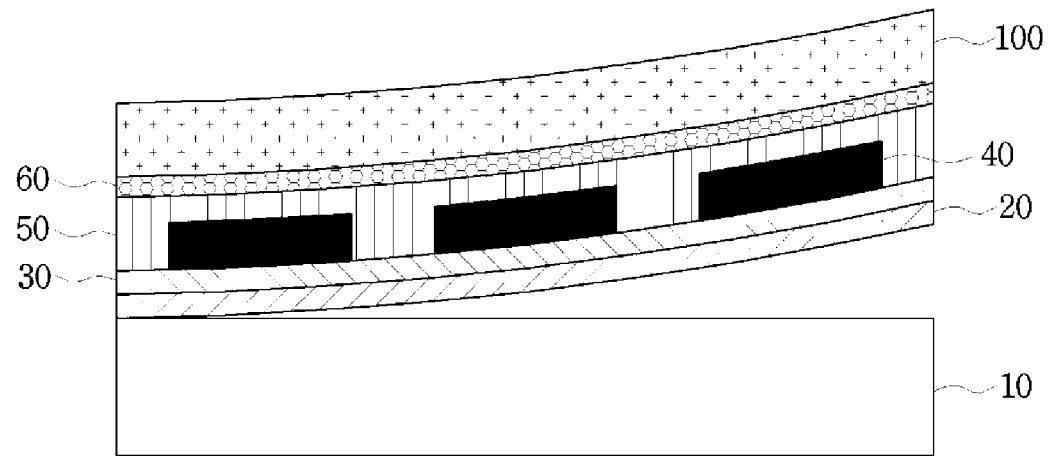

【Figure 8】
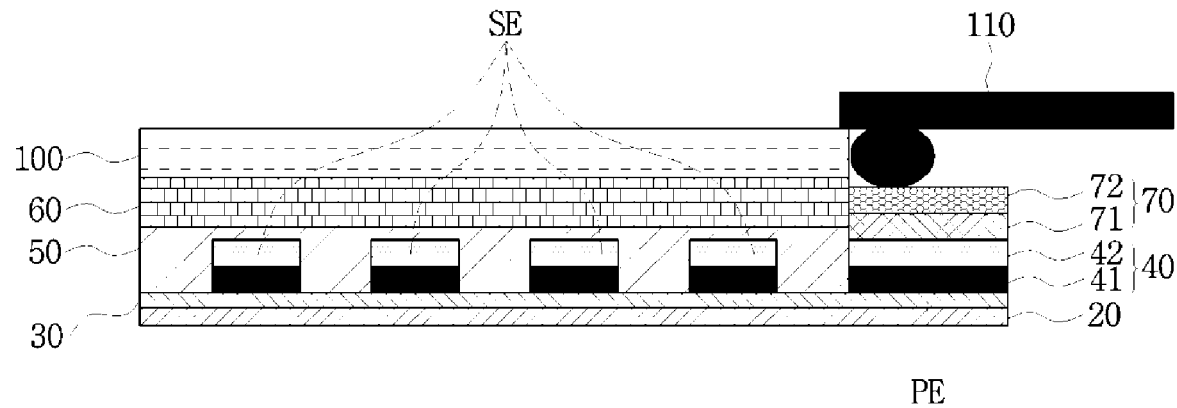
【Figure 9a】
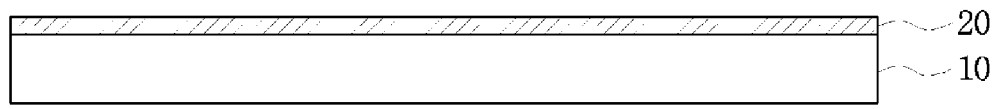
【Figure 9b】
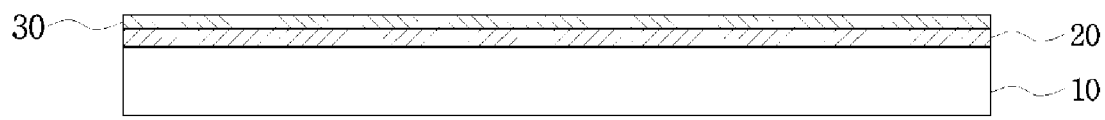
【Figure 9c】
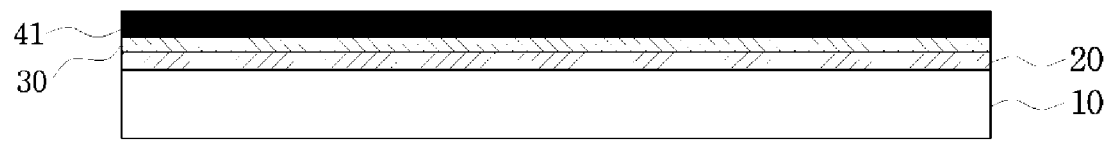
【Figure 9d】
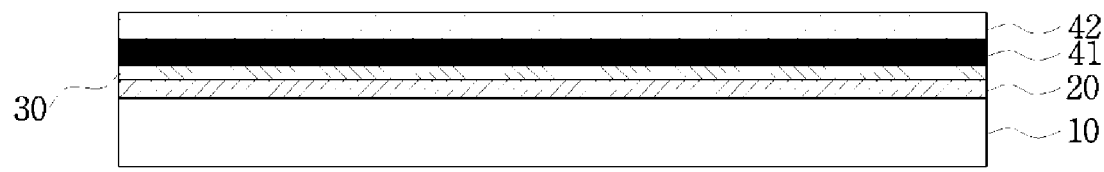

[Figure 9e]
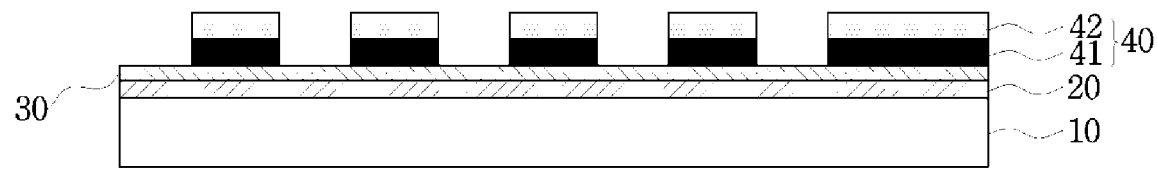
[Figure 9f]
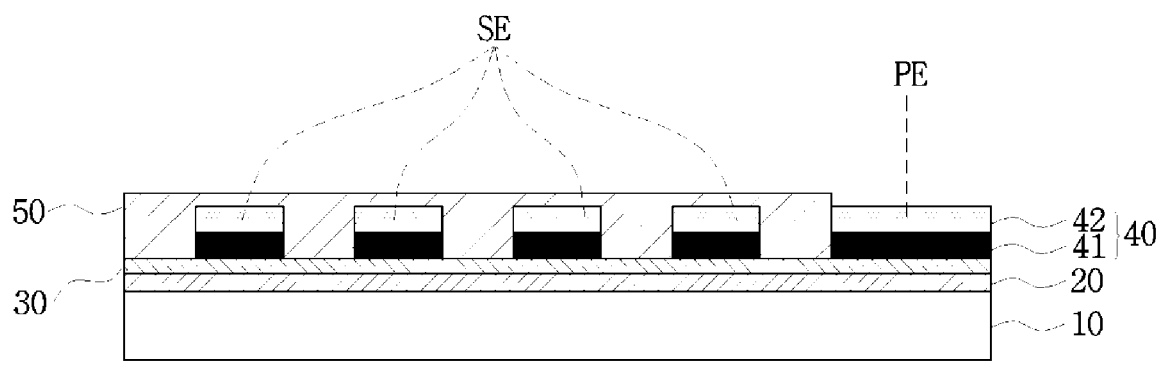
[Figure 9g]
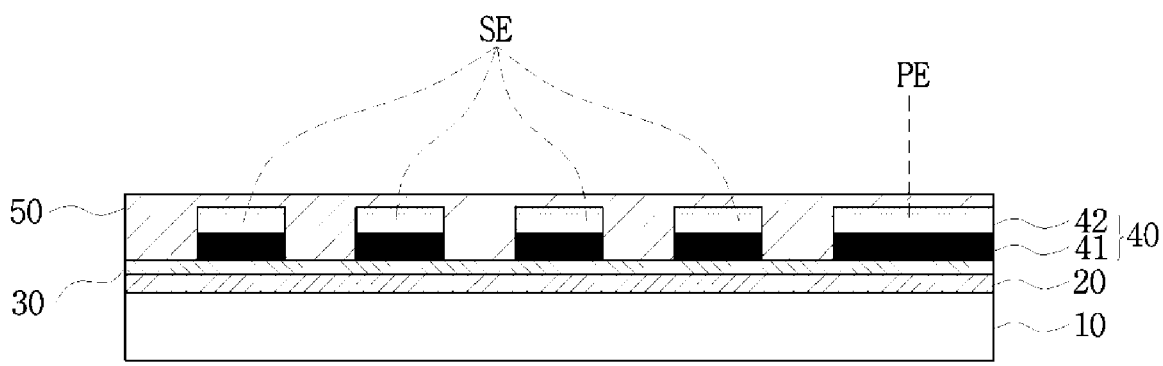
[Figure 9h]
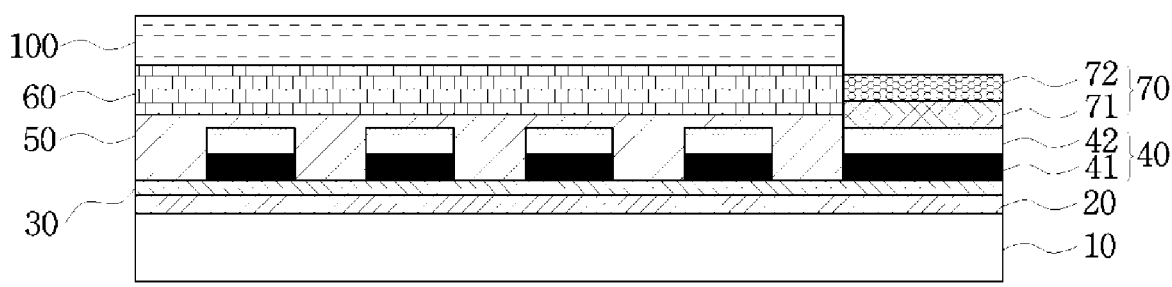

[Figure 9i]
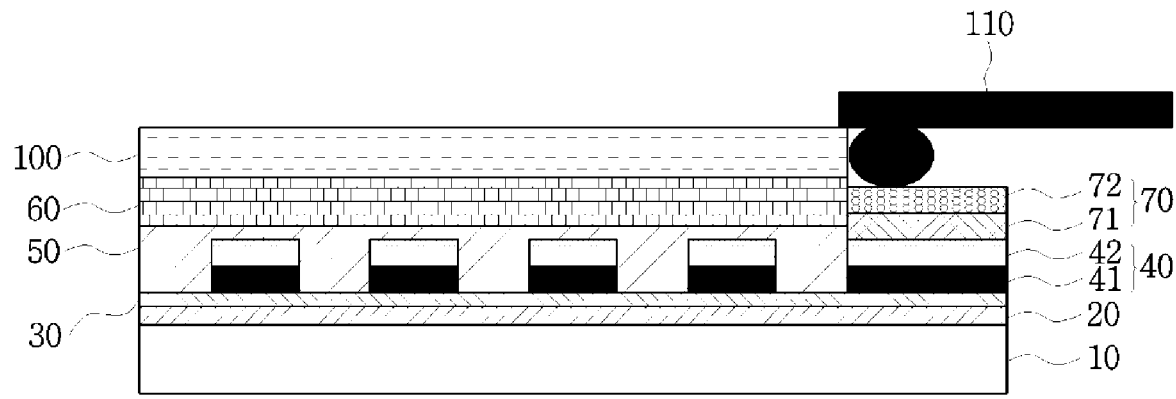
[Figure 9j]
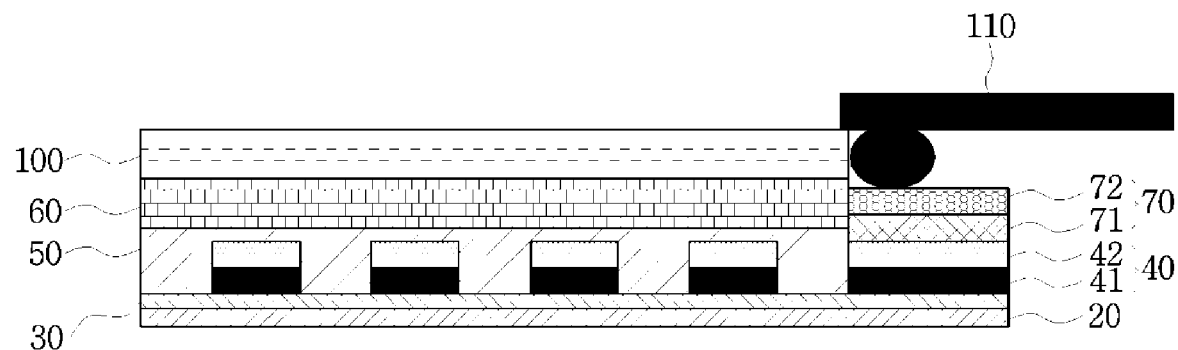
[Figure 10a]
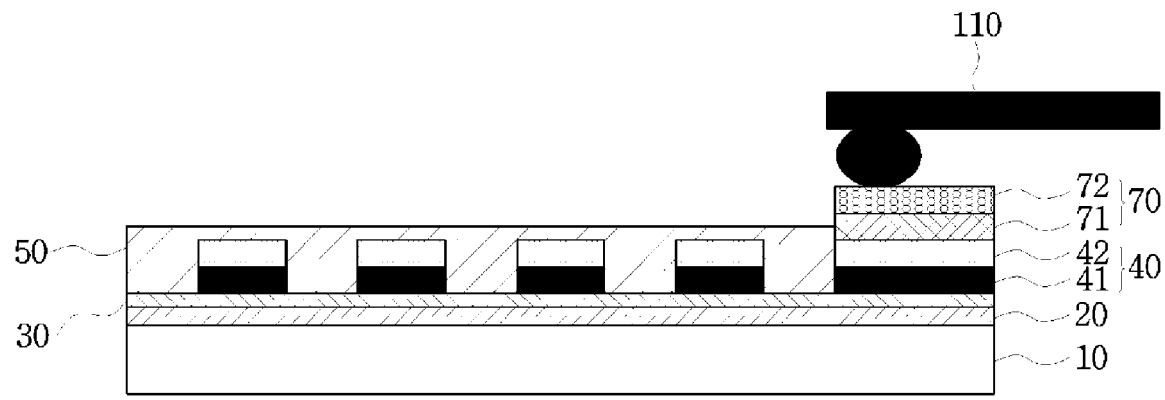

【Figure 10b】
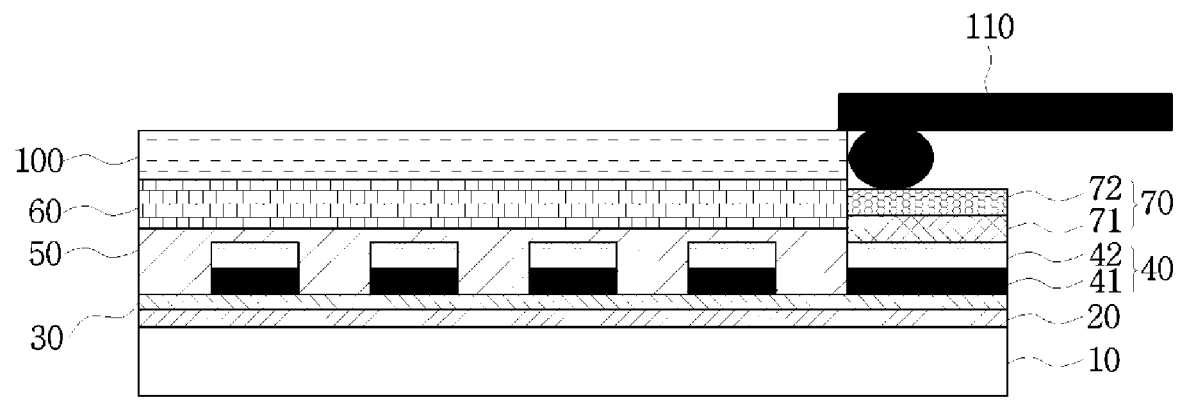
【Figure 10c】
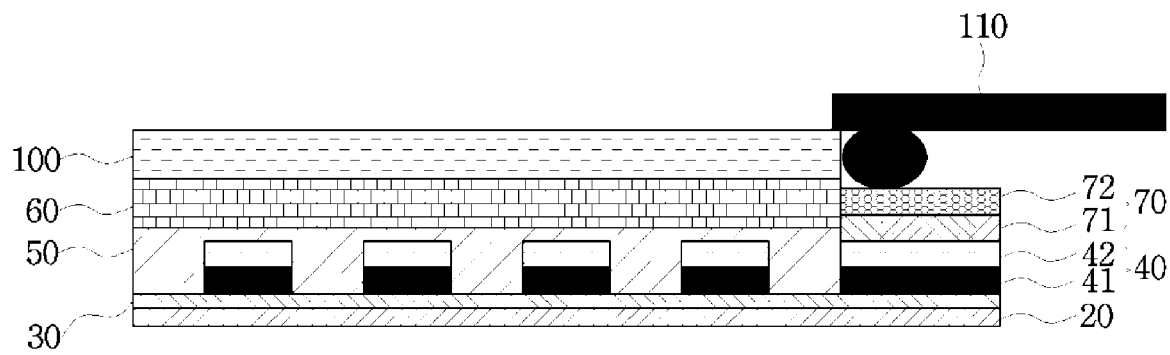

FILM TOUCH SENSOR AND MANUFACTURING METHOD THEREFOR

CROSS REFERENCE TO RELATED APPLICATIONS

This application is a National Stage of International Application No. PCT/KR2015/012356, filed Nov. 17, 2015, claiming priorities based on Korean Patent Application Nos. 10-2014-0162892, filed Nov. 20, 2014, 10-2014-0162967, filed Nov. 20, 2014, 10-2014-0176204, filed Dec. 9, 2014, and 10-2014-0176206, filed Dec. 9, 2014, the contents of all of which are incorporated herein by reference in their entirety.

TECHNICAL FIELD

The present invention relates to a film touch sensor. Particularly, the present invention relates to a film touch sensor prepared by carrying out procedures on a carrier substrate and forming an electrode pattern, and the preparation method thereof.

BACKGROUND ART

Various electronic devices adopt a touch input mode which is regarded as a next-generation input technique. In this regard, many researches and developments have been actively made to provide a touch sensor capable of being applied in various environments and accurately recognizing input information by touch.

For example, since electronic devices having a touch display have been focused on an ultralight and low power thin-film flexible display having improved portability as a next-generation display, there is a need for touch sensors applicable in the display.

The flexible display is prepared on a flexible substrate that can bend, fold or roll without damage of its properties, and it may be in the form of a flexible LCD, a flexible OLED, electronic paper, etc.

In order to apply the touch input mode to such a flexible display, it needs a touch sensor having good bending, restoring, flexible and stretchable properties.

The flexible display may be prepared using a film touch sensor, for example, a wiring board comprising wiring embedded in a transparent resin substrate.

The wiring board may be prepared by a process comprising the steps of forming metal wiring on a substrate, applying and drying a transparent resin solution to cover the metal wiring and form a transparent resin substrate, and peeling the transparent resin substrate from the substrate.

For the effective peeling, organic releasing materials such as a silicon resin and a fluorine resin, and inorganic releasing materials such as a thin film of diamond-like carbon (DLC) and a thin film of zirconium oxide are pre-formed on the surface of the substrate.

However, the inorganic releasing materials may fail to effectively peel the metal wiring and the resin substrate from the surface of the substrate on which a part of the metal wiring and the resin substrate may be remained, while the organic releasing material may be come out from the surface of the metal wiring and the resin substrate.

That is, it is difficult to induce perfect peeling of the metal wiring from the substrate despite of using the releasing materials.

Korean Patent No. 10-1191865 discloses a method for preparing a flexible substrate having metal wiring embedded therein, comprising forming a sacrificial layer, metal wiring and a polymer material on a substrate and removing the sacrificial layer by a solvent or light to peel the metal wiring and the polymer material from the substrate.

The removal of the sacrificial layer according to the above method is, however, difficult to be carried out in a large size, and various base films are difficult to be used in the above method which cannot be implemented in a high temperature condition.

DISCLOSURE OF INVENTION

Technical Problem

An object of the present invention is to provide a film touch sensor comprising an insulation layer that is formed on an electrode pattern layer consisting of a transparent conductive layer, the insulation layer being used as a planarization layer, an adhesive layer or a base layer, and a method of preparing the film touch sensor.

Another object of the present invention is to provide a film touch sensor in which a separation layer is formed on a carrier substrate prior to the formation procedures of the touch sensor and is separated from the carrier substrate so that the separation layer can be used as a layer of covering wiring, and a method of preparing the film touch sensor.

Still another object of the present invention is to provide a film touch sensor that is implemented on a carrier substrate to provide high definition and heat resistance, as compared with a conventional touch sensor that has been directly formed on a base film, and can apply various base films, and a method of preparing the film touch sensor.

Still another object of the present invention is to provide a film touch sensor in which a peeling strength- and thickness-controlled separation layer is formed on a carrier substrate prior to the formation procedures of the touch sensor, and the separation layer needs not to be removed after it is separated from the carrier substrate, and a method of preparing the film touch sensor.

Still another object of the present invention is to provide a film touch sensor which further comprises an elasticity-controlled protective layer between the separation layer and the insulation layer to inhibit crack generation due to a difference of stress-relieving capability in each layer, and a method of preparing the film touch sensor.

Still another object of the present invention is to provide a film touch sensor in which a separation layer is formed on a carrier substrate prior to the formation procedures of the touch sensor and the film touch sensor is attached with a circuit board via an open area of an insulation layer before or after it is separated from the carrier substrate, and a method of preparing the film touch sensor.

Objects of the present invention are not limited to the aforementioned objects, and still other objects thereof not mentioned will be understandable by those skilled in the art from the following descriptions.

Technical Solution

According to one aspect of the present invention, there is provided a film touch sensor, comprising a separation layer; an electrode pattern layer formed on the separation layer and comprising a sensing electrode and a pad electrode formed at one end of the sensing electrode; and an insulation layer formed on the electrode pattern layer to cover the electrode pattern layer.

The insulation layer may be formed on the sensing electrode so that the pad electrode is exposed.

Also, the film touch sensor may further comprise a protective layer formed between the separation layer and the electrode pattern layer.

The protective layer and the insulation layer may have an elasticity modulus difference at 25° C. of 300 MPa or less.

Also, the protective layer and the insulation layer may have an elasticity modulus difference at 25° C. of 100 MPa or less.

The insulation layer may be formed to cover the sensing electrode of the electrode pattern layer and the insulation layer may be planarized on the opposite surface of the surface in contact with the sensing electrode.

Also, the insulation layer may be formed from at least one material selected from the group consisting of a curable prepolymer, a curable polymer and a plastic polymer.

In addition, the insulation layer may be formed from a varnish-type material being capable of filming.

The varnish-type material may comprise at least one selected from the group consisting of polysilicone, polyimide and polyurethane materials.

The insulation layer may be an adhesive layer.

The adhesive layer may comprise at least one material selected from the group consisting of polyesters, polyethers, polyurethanes, epoxies, silicones and acrylics.

The film touch sensor may further comprise a base film formed on the insulation layer.

Also, the film touch sensor may further comprise an adhesive layer formed between the insulation layer and the base film.

The adhesive layer may be formed from a pressure-sensitive adhesive (PSA) or an adhesive.

The base film may be any one selected from the group consisting of a polarizing plate, an isotropic film, a retardation film and a protective film.

The electrode pattern layer may be a transparent conductive layer.

The transparent conductive layer may be formed from at least one selected from the group consisting of a metal, a metal nanowire, a metal oxide, carbon nanotube, graphene, a conductive polymer and a conductive ink.

The electrode pattern layer may further comprise a bridge electrode.

The electrode pattern layer may consist of two or more conductive layers.

The electrode pattern layer may comprise at least one electrode pattern layer formed from a metal or a metal oxide.

The electrode pattern layer may be a laminate of a first electrode layer formed from a metal oxide and a second electrode layer formed from a metal nanowire or a metal.

The separation layer may be formed on a carrier substrate and then separated therefrom.

The separation layer may have a peeling strength of 1N/25 mm or less when it is separated from the carrier substrate.

Also, the separation layer may have a peeling strength of 0.1N/25 mm or less when it is separated from the carrier substrate.

The separation layer may have a surface energy of 30 to 70 mN/m after it is peeled from the carrier substrate.

The separation layer may have a surface energy difference between it and the carrier substrate of 10 mN/m or more.

The carrier substrate may be made of a glass.

The separation layer may be made of an organic polymer.

The organic polymer may comprise at least one selected from the group consisting of polyimide, poly vinyl alcohol, polyamic acid, polyamide, polyethylene, polystylene, polynorbornene, phenylmaleimide copolymer, polyazobenzene, polyphenylenephthalamide, polyester, polymethyl methacrylate, polyarylate, cinnamate polymer, coumarin polymer, phthalimidine polymer, chalcone polymer and aromatic acetylene polymer.

The separation layer may have a thickness of 10 to 1000 nm.

The separation layer may have a thickness of 50 to 500 nm.

Also, the film touch sensor may further comprise a circuit board that electrically connects with the pad electrode.

In addition, the film touch sensor may further comprise a pad pattern layer formed on the pad electrode, in which the insulation layer may be formed on the sensing electrode so that the pad pattern layer is exposed.

The pad pattern layer may be formed from at least one selected from the group consisting of a metal, a metal nanowire, a metal oxide, carbon nanotube, graphene, a conductive polymer and a conductive ink.

The pad pattern layer may consist of two or more conductive layers.

According to another aspect of the present invention, there is provided a method for preparing the above film touch sensor, comprising the steps of applying a separation layer on a carrier substrate; curing the separation layer; forming an electrode pattern layer comprising a sensing electrode and a pad electrode on the separation layer; applying an insulation layer on the electrode pattern layer to cover the electrode pattern layer; and bringing the insulation layer into filming.

The method for preparing the film touch sensor may further comprise the step of forming a protective layer on the separation layer after the curing of the separation layer, by which the formation of the electrode pattern layer may be carried out on the protective layer.

After the formation of the protective layer, the method for preparing the film touch sensor may further comprise the step of removing a part of the protective layer corresponding to a region that the pad electrode is formed so that the separation layer is exposed.

After the filming of the insulation layer, the method for preparing the film touch sensor may further comprise the step of removing a part of the insulation layer that connects with a circuit board.

The curing of the separation layer may be carried out by at least one method selected from thermal curing and UV curing.

The filming of the insulation layer may be carried out by at least one method selected from thermal curing, UV curing, thermal drying and vacuum drying.

Also, the method for preparing the film touch sensor may further comprise the step of attaching a base film to the insulation layer.

The attachment of the base film may be carried out by direct adhesion between the base film and the insulation layer.

Also, the attachment of the base film may be carried out by adhesion between the base film and the insulation layer with an adhesive.

In addition, the attachment of the base film may be carried out by adhesion between the base film and the insulation layer with a pressure-sensitive adhesive.

The applying of the insulation layer may be carried out by forming the insulation layer to cover only the sensing electrode so that the pad electrode is exposed.

After the filming of the insulation layer, the method for preparing the film touch sensor may further comprise the step of forming a pad pattern layer on the pad electrode.

The method for preparing the film touch sensor may further comprise the step of attaching a circuit board to the pad electrode or the pad pattern layer after the attachment of the base film; and the step of removing the carrier substrate by separating the separation layer from the carrier substrate after the attachment of the circuit board.

Alternatively, the method for preparing the film touch sensor may further comprise the step of removing the carrier substrate by separating the separation layer from the carrier substrate after the attachment of the base film; and the step of attaching a circuit board to the pad electrode or the pad pattern layer after the removal of the carrier substrate.

Also, after the filming of the insulation layer, the method for preparing the film touch sensor may further comprise the step of attaching a circuit board to the pad electrode or the pad pattern layer.

After the attachment of the circuit board, the method for preparing the film touch sensor may further comprise the steps of attaching a base film to the insulation layer; and removing the carrier substrate by separating the separation layer from the carrier substrate.

In addition, after the filming of the insulation layer, the method for preparing the film touch sensor may further comprise the steps of attaching a circuit board to the pad electrode or the pad pattern layer; and removing the carrier substrate by separating the separation layer from the carrier substrate.

The removal of the carrier substrate may be carried out by separating the separation layer from the carrier substrate by way of lift-off or peel-off.

The removal of the carrier substrate may be carried out by separating the separation layer from the carrier substrate with a force of 1N/25 mm or less.

The removal of the carrier substrate may be carried out by separating the separation layer from the carrier substrate with a force of 0.1N/25 mm or less.

The formation of the electrode pattern layer may comprise forming a first electrode layer with a transparent conductive layer and bringing the first electrode layer into patterning.

The formation of the electrode pattern layer may further comprise forming a bridge electrode.

After the formation of the first electrode layer, the formation of the electrode pattern layer may further comprise forming a second electrode layer with a metal nanowire or a metal on the first electrode layer.

The first electrode layer and the second electrode layer are simultaneously subject to patterning.

The formation of the pad pattern layer may comprise a first step of forming a metallic conductive layer on the pad electrode, and a second step of bringing the metallic conductive layer into patterning.

According to still another aspect of the present invention, there is provided a method for preparing the above film touch sensor, comprising the steps of forming a separation layer on a carrier substrate; forming an electrode pattern layer comprising a sensing electrode and a pad electrode on the separation layer; forming an insulation layer on the electrode pattern layer; removing a part of the insulation layer, the part being formed on the pad electrode; and attaching a base film to the insulation layer.

Advantageous Effects

The film touch sensor and the preparation method thereof according to the present invention have the following effects:

First, the insulation layer formed on patterns of a transparent conductive layer can be used as a planarization layer, an adhesive layer or a base layer, thereby enhancing the efficiency of procedures for preparing a touch sensor.

Second, the separation layer can be used as a layer of covering wiring since it is formed on a carrier substrate prior to the formation procedures of the touch sensor and is separated from the carrier substrate, thereby enhancing the efficiency and productivity of procedures.

Third, the procedures implementing the touch sensor on a carrier substrate can provide high definition and heat resistance and can apply various base films.

Fourth, the separation layer is not required to be removed after it is separated from the carrier substrate, thereby achieving simple procedures and overcoming problems that may occur in the touch sensor from a removal procedure.

Fifth, the elasticity-controlled protective layer which is further formed between the separation layer and the insulation layer can inhibit crack generation due to a difference of stress-relieving capability of each layer.

Sixth, the film touch sensor can be prevented from curl generation after it is separated from the carrier substrate.

Seventh, the film with an electrode formed therein can be attached with a circuit board via an open area of a base film before or after it is separated from the carrier substrate, thereby enhancing the efficiency of procedures.

DESCRIPTION OF DRAWINGS

FIGS. 1 to 4 are cross-sectional views showing the structure of the film touch sensor according to one embodiment of the present invention.

FIGS. 5a to 5f schematically show procedures according to a first embodiment of the film touch sensor preparation method of the present invention.

FIGS. 6a to 6b schematically show procedures according to a second embodiment of the film touch sensor preparation method of the present invention.

FIGS. 7a to 7b schematically show procedures according to a third embodiment of the film touch sensor preparation method of the present invention.

FIG. 8 is a cross-sectional view showing the structure of the film touch sensor according to another embodiment of the present invention.

FIGS. 9a to 9j schematically show procedures according to a fourth embodiment of the film touch sensor preparation method of the present invention.

FIGS. 10a to 10c schematically show procedures according to a fifth embodiment of the film touch sensor preparation method of the present invention.

BEST MODE

Hereinafter, preferred embodiments of a film touch sensor and the preparation method thereof according to the present invention will be described in detail as follows.

Features and advantages of the film touch sensor and the preparation method thereof according to the present invention will be apparent through the following detailed description for each of the embodiments.

FIGS. 1 to 4 are cross-sectional views showing the structure of the film touch sensor according to one embodiment of the present invention.

Also, FIG. 8 is a cross-sectional view showing the structure of the film touch sensor according to another embodiment of the present invention.

The present invention is to provide a film touch sensor in which a separation layer is formed on a carrier substrate prior to the formation procedures of the touch sensor and is separated from the carrier substrate so that the separation layer can be used as a layer of covering wiring, thereby ensuring high definition and heat resistance, unlike a conventional touch sensor that has been directly formed on a base film, and allowing the application of various base films.

The present invention is to provide a film touch sensor in which a separation layer is formed on a carrier substrate prior to the formation procedures of the touch sensor and an insulation layer is formed to be used as an adhesive layer for film adhesion later or to be used as a base (film) layer or a planarization layer. The insulation layer used as a planarization layer can prevent the corrosion of an electrode pattern, and also the planarized surface thereof can suppress the generation of fine bubbles during adhesion with a base film using a pressure-sensitive adhesive or an adhesive.

The film touch sensor according to one embodiment of the present invention may comprise a separation layer; an electrode pattern layer formed on the separation layer and comprising a sensing electrode and a pad electrode formed at one end of the sensing electrode; and an insulation layer formed on the electrode pattern layer to cover the electrode pattern layer, as shown in FIG. 1.

The separation layer 20 may be made of an organic polymer, for example, at least one selected from the group consisting of polyimide, poly vinyl alcohol, polyamic acid, polyamide, polyethylene, polystylene, polynorbornene, phenylmaleimide copolymer, polyazobenzene, polyphenylenephthalamide, polyester, polymethyl methacrylate, polyarylate, cinnamate polymer, coumarin polymer, phthalimidine polymer, chalcone polymer and aromatic acetylene polymer.

The separation layer 20 is applied on a carrier substrate 10, and it is later separated from the carrier substrate 10 after the electrode pattern layer is formed thereon.

The separation layer 20 preferably has a peeling strength of 1N/25 mm or less, more preferably 0.1N/25 mm or less when it is separated from the carrier substrate. That is, it is preferred that the separation layer 20 is formed from a material that can maintain a physical force applied during separation of the separation layer 20 from the carrier substrate 10 within 1N/25 mm, particularly 0.1N/25 mm.

If the peeling strength of the separation layer 20 exceeds 1N/25 mm, it is difficult to cleanly separate the separation layer from the carrier substrate, so the separation layer 20 may be remained on the carrier substrate. Also, crack may be generated on at least one of separation layer 20, protective layer 30, electrode pattern layer 40 and insulation layer 50.

In particular, the peeling strength of the separation layer 20 is preferred to have 0.1N/25 mm or less since it allows the control of curl generation in the film after separation from the carrier substrate. The curl may deteriorate the efficiency of adhesion and cutting procedures even though it does not affect the function itself of the film touch sensor. Therefore, it is favorable to minimize curl generation.

The separation layer 20 preferably has a thickness of 10 to 1000 nm, more preferably 50 to 500 nm. If the thickness of the separation layer 20 is less than 10 nm, the separation layer may be unevenly formed to induce the formation of uneven electrode pattern, the peeling strength of the separation layer may be locally raised to cause breakage, or curl control may be failed after the separation layer is separated from the carrier substrate. If the thickness of the separation layer is more than 1000 nm, the peeling strength of the separation layer may not be lowered any more, and the flexibility of the film may be deteriorated.

The separation layer preferably has a surface energy of 30 to 70 mN/m after it is peeled from the carrier substrate. Also, the separation layer preferably has a surface energy difference between it and the carrier substrate of 10 mN/m or more. The separation layer should maintain stable adhesion with the carrier substrate until it is separated from the carrier substrate and then should be easily separated without breakage of the film touch sensor or without curl generation. When the surface energy of the separation layer satisfies the range of 30 to 70 mN/m, the peeling strength thereof can be controlled, good adhesion between the separation layer and the adjacent protective layer or the electrode pattern layer can be ensured to improve the efficiency of procedures. Also, when the separation layer satisfies a surface energy difference between it and the carrier substrate of 10 mN/m or more, the separation layer can be easily separated from the carrier substrate to prevent the breakage of the film touch sensor or crack generation in each layer of the film touch sensor.

The separation layer 20 acts as a layer of covering an electrode pattern layer 40 formed thereon or as a layer of protecting the electrode pattern layer 40 from external contact after the separation layer 20 is separated from the carrier substrate.

On the separation layer 20, at least one protective layer 30 may be further formed. Since only the separation layer 20 may be difficult to achieve complete protection of electrode pattern from external contact or impact, at least one protective layer 30 can be formed for protection purpose.

The protective layer 30 may comprise at least one of an organic insulating film and an inorganic insulating film and may be formed by way of coating and curing, or deposition.

The protective layer may be formed so that a part of the protective layer corresponding to a region that the pad electrode will be formed is removed or a region that the pad electrode will be formed is excluded, for connection with a circuit. Also, in the case that a pad pattern layer is formed on the bottom of the pad electrode, for the formation of the pad pattern layer, the protective layer may be applied to fully cover the top of separation layer, followed by patterning, or it may be applied in the other part excluding a region that the pad pattern layer will be formed.

The electrode pattern layer 40 is formed on the separation layer 20 or on the protective layer 30. The electrode pattern layer 40 is configured to comprise a sensing electrode that senses touch operation, and a pad electrode formed at one end of the sensing electrode. The sensing electrode may comprise an electrode for sensing touch operation and a wiring pattern connected to the electrode.

The pad pattern layer may be formed on the pad electrode or on the bottom of the pad electrode. The pad electrode may electrically connect with a circuit board through the pad pattern layer, and the pad pattern layer acts to lower contact resistance when the pad electrode connects with the circuit board. In the case that the circuit board is attached at the direction of the insulation layer, the pad pattern layer may be formed on the pad electrode. In the case that the circuit board is attached at the direction of the separation layer, the pad pattern layer may be formed on the bottom of the pad electrode. If contact resistance is sufficiently low when the pad electrode connects with the circuit board, the pad pattern layer may be omitted.

The pad pattern layer may be formed from at least one selected from the group consisting of a metal, a metal nanowire, a metal oxide, carbon nanotube, graphene, a conductive polymer and a conductive ink.

The electrode pattern layer 40 may be a transparent conductive layer and may be formed from at least one selected from the group consisting of a metal, a metal nanowire, a metal oxide, carbon nanotube, graphene, a conductive polymer and a conductive ink.

Examples of the metal may include gold (Au), silver (Ag), copper (Cu), molybdenum (Mo), aluminum, palladium, neodymium, and an alloy of Ag—Pd—Cu (APC).

Examples of the metal nanowire may include silver nanowire, copper nanowire, zirconium nanowire, and gold nanowire.

Examples of the metal oxide may include indium tin oxide (ITO), indium zinc oxide (IZO), indium zinc tin oxide (IZTO), aluminum zinc oxide (AZO), gallium zinc oxide (GZO), fluorine-doped tin oxide (FTO), zinc oxide (ZnO), indium tin oxide-Ag-indium tin oxide (ITO-Ag-ITO), indium zinc oxide-Ag-indium zinc oxide (IZO-Ag-IZO), indium zinc tin oxide-Ag-indium zinc tin oxide (IZTO-Ag-IZTO) and aluminum zinc oxide-Ag-aluminum zinc oxide (AZO-Ag-AZO).

Also, the pad pattern layer 40 may be formed from carbon materials such as carbon nanotube (CNT) and graphene.

The conductive polymer may comprise polypyrrole, polythiophene, polyacetylene, PEDOT and polyaniline or may be formed therefrom.

The conductive ink may be a mixture of metal powder and a curable polymer binder, and it may be used to form an electrode.

If necessary, the electrode pattern layer 40 may consist of two or more conductive layers in the form of a first electrode layer 41 and a second electrode layer 42, so as to reduce electric resistance.

For example, the electrode pattern layer 40 may consist of a single layer of ITO, AgNW (silver nanowire) or a metal mesh, or two or more layers comprising a first electrode layer 41 of a transparent metal oxide such as ITO, and a second electrode layer 42 of a metal or AgNW formed on the ITO electrode layer so as to lower electric resistance more and more.

Also, the electrode pattern layer 40 may comprise at least one layer of a metal or a metal oxide so as to improve electric conductivity. More specifically, the electrode pattern layer may be obtained by forming a transparent conductive layer of a metal or a metal oxide on the separation layer or the protective layer and further laminating a transparent conductive layer to form an electrode pattern; or may be obtained by laminating at least one transparent conductive layer on the separation layer or the protective layer and further forming a transparent conductive layer of a metal or a metal oxide to form an electrode pattern. For example, the electrode pattern may have a structure that a pattern layer of a metal or a metal oxide is further formed between the separation layer and the electrode pattern layer; a structure that a pattern layer of a metal or a metal oxide is further formed between the electrode pattern layer and the insulation layer; or a structure that a pattern layer of a metal or a metal oxide is further formed between the protective layer and the electrode pattern layer, and at least one electrode pattern layer of a transparent conductive material may be further formed.

Applicable lamination structures of the electrode pattern layer 40 may, for example, include a structure that a metal oxide layer is laminated and a silver nanowire layer is laminated thereon; a structure that a metal oxide layer is laminated and a metal layer is laminated thereon; a structure that a metal oxide layer is laminated and a metal mesh electrode layer is laminated thereon, a structure that a silver nanowire layer is laminated and a metal oxide layer is laminated thereon; a structure that a metal layer is laminated and a metal oxide layer is laminated thereon; a structure that a metal mesh electrode layer is laminated and a metal oxide layer is laminated thereon; a structure that a metal oxide layer is laminated, a silver nanowire layer is laminated on the metal oxide layer, and a metal layer is laminated thereon; a structure that a silver nanowire layer is laminated, a metal oxide layer is laminated on the silver nanowire layer, and a metal layer is laminated thereon. These electrode lamination structures may be modified depending on the signal processing and resistance of the touch sensor, so the present invention is not limited thereto.

The electrode pattern layer may be configured to have an insulation layer between the first electrode pattern layer and the second electrode pattern layer. Also, the insulation layer may be subject to patterning to form contact holes, so that the second conductive layer may act as a bridge electrode.

In addition, the structure of the electrode pattern layer is described in terms of touch sensor modes.

The electrode pattern layer preferably has the pattern structure used in capacitance mode such as mutual-capacitance mode and self-capacitance mode.

The mutual-capacitance mode may have a grid electrode structure of a horizontal axis and a vertical axis. The point of intersection between electrodes on the horizontal axis and the vertical axis may have a bridge electrode. Alternatively, each electrode pattern layer on the horizontal axis and the vertical axis may be formed and each of them may be electrically apart from each other.

The self-capacitance mode may have an electrode layer structure that recognizes the change of capacitance using one electrode in each position.

On the electrode pattern layer 40, the insulation layer 50 is formed to inhibit the corrosion of the electrode pattern and protect the surface of the electrode pattern. The insulation layer 50 fills a gap in the electrode or the wiring and it is preferably formed to have a certain thickness. That is, the insulation layer is preferably planarized on the opposite surface of the surface in contact with the electrode pattern layer 40 so that the uneven part of the electrode is not emerged.

It is preferred that an elasticity modulus difference at 25° C. between the protective layer 30 and the insulation layer 50 satisfies 300 MPa or less, more preferably 100 MPa or less, in order to inhibit crack generation due to a difference of stress-relieving capability between these layers. If the elasticity modulus difference at 25° C. between the insulation layer and the protective layer exceeds 300 MPa, crack is generated due to an imbalance between the insulation layer and the protective layer in deformation energy and stress-relieving capability.

Such an elasticity modulus difference is measured under the condition of 25° C. which falls in the use environment of a user so as to prevent crack generation.

The insulation layer may be formed from any organic insulating material capable of satisfying an elasticity modulus difference at 25° C. between it and the protective layer to be 300 MPa or less. For example, thermally curable or UV curable organic polymers are preferably used. Also, the insulation layer may be formed from at least one selected from the group consisting of an epoxy compound, an acrylic compound and a melamine compound.

In addition, in the aspect of a material form, the insulation layer may be formed from at least one material selected from the group consisting of a curable prepolymer, a curable polymer and a plastic polymer.

The insulation layer 50 by itself may act as a base film. In this case, it is preferably made of a varnish-type material being capable of filming. The varnish-type material may comprise at least one selected from the group consisting of polysilicone-based materials such as polydimethylsiloxane (PDMS) and polyorganosiloxane (POS), polyimide-based materials, and polyurethane-based materials such as spandex.

In the film touch sensor of the present invention, the pad electrode may electrically connect with a circuit board.

The circuit board may be a flexible printed circuit board (FPCB) and functions to electrically connect the film touch sensor of the present invention with a touch switch circuit.

The circuit board has an electrode corresponding to the pad electrode at one end thereof, and the circuit board may electrically connect with the pad electrode by a conductive adhesive. Also, the film touch sensor may connect with a circuit board via an open area of the top of the pad electrode or via the separation layer. The pad electrode may have a pad pattern layer formed with a material having a low resistance on the top or bottom thereof, and in this case the circuit board may connect with the pad electrode through the pad pattern layer.

According to another embodiment of the present invention as shown in FIG. 3, the film touch sensor may comprise a separation layer; an electrode pattern layer formed on the separation layer and comprising a sensing electrode and a pad electrode formed at one end of the sensing electrode; an insulation layer formed on the electrode pattern layer to cover the electrode pattern layer; and a base film directly formed on the insulation layer.

The insulation layer 50 by itself may act as an adhesive layer consisting of a pressure-sensitive adhesive (PSA) or an adhesive. Such an insulation layer may comprise at least one selected from the group consisting of polyester, polyether, polyurethane, epoxy, silicon and acrylate. When the insulation layer 50 acts as an adhesive layer, the base film 100 may be directly attached on the insulation layer 50.

In the present invention, the base film 100 may be a transparent film or a polarizing plate.

The transparent film is not limited if it has good transparency, mechanical strength and thermal stability. Specific examples of the transparent film may include thermoplastic resins, e.g., polyester resins such as polyethylene terephthalate, polyethylene isophthalate, polyethylene naphthalate and polybutylene terephthalate; cellulose resins such as diacetylcellulose and triacetylcellulose; polycarbonate resins; acrylate resins such as polymethyl (meth)acrylate and polyethyl (meth)acrylate; styrene resins such as polystyrene and acrylonitrile-styrene copolymer; polyolefin resins such as polyethylene, polypropylene, polyolefin having a cyclic or norbornene structure, and ethylene-propylene copolymer; vinyl chloride resins; amide resins such as nylon and aromatic polyamide; imide resins; polyethersulfone resins; sulfone resins; polyether ether ketone resins; polyphenylene sulfide resins; vinyl alcohol resins; vinylidene chloride resins; vinyl butyral resin; allylate resin; polyoxymethylene resins; and epoxy resins. Also, a film consisting of a blend of the thermoplastic resins may be used. In addition, thermally curable or UV curable resins such as (meth)acrylate, urethane, acrylic urethane, epoxy and silicon resins may be used. Such a transparent film may have a suitable thickness. For example, considering workability in terms of strength and handling, or thin layer property, the thickness of the transparent film may range from 1 to 500 µm, preferably 1 to 300 µm, more preferably 5 to 200 µm.

The transparent film may contain at least one suitable additive. Examples of the additive may include an UV absorber, an antioxidant, a lubricant, a plasticizer, a releasing agent, a coloring-preventing agent, an anti-flame agent, a nucleation agent, an anti-static agent, a pigment and a colorant. The transparent film may comprise various functional layers including a hard coating layer, an anti-reflective layer and a gas barrier layer, but the present invention is not limited thereto. That is, other functional layers may also be included depending on the desired use.

If necessary, the transparent film may be surface-treated. For example, the surface treatment may be carried out by drying method such as plasma, corona and primer treatment, or by chemical method such as alkali treatment including saponification.

Also, the transparent film may be an isotropic film, a retardation film or a protective film.

In the case of the isotropic film it is preferred to satisfy an in-plane retardation (Ro) of 40 nm or less, preferably 15 nm or less and a thickness retardation (Rth) of −90 nm to +75 nm, preferably −80 nm to +60 nm, particularly −70 nm to +45 nm, the in-plane retardation (Ro) and thickness retardation (Rth) being represented by the following equations.

$$Ro=[(nx-ny)\times d]$$

$$Rth=[(nx+ny)/2-nz]\times d$$

wherein, nx and ny are each a main refractive index in a film plane, nz is a refractive index in the thickness direction of film, and d is a thickness of film.

The retardation film may be prepared by uniaxial stretching or biaxial stretching of a polymer film coating of a polymer or coating of a liquid crystal, and it is generally used for improvement or control of optical properties, e.g., viewing angle compensation, color sensitivity improvement, light leakage prevention, or color control of a display.

The retardation film may include a half-wave (½) or quarter-wave (¼) plate, a positive C-plate, a negative C-plate, a positive A-plate, a negative A-plate, and a biaxial plate.

The protective film may be a polymer resin film comprising a pressure-sensitive adhesive (PSA) layer on at least one surface thereof, or a self-adhesive film such as a polypropylene. The protective film may be used for protection of the touch sensor and improvement of processibility.

The polarizing plate may be any one known to be used in a display panel.

Specifically, the polarizing plate may be prepared by laminating a protective layer on at least one surface of a polarizer obtained by dying iodine or a dichroic pigment on a stretched polyvinyl alcohol resin film, by orienting a liquid crystal so as to provide a polarizer function, or by coating an oriented resin such as polyvinyl alcohol on a transparent film, followed by stretching and dying, but the present invention is not limited thereto.

According to another embodiment of the present invention as shown in FIG. 4, the film touch sensor may comprise a separation layer; an electrode pattern layer formed on the separation layer and comprising a sensing electrode and a pad electrode formed at one end of the sensing electrode; an insulation layer formed on the electrode pattern layer to cover the electrode pattern layer; an adhesive layer formed on the insulation layer; and a base film formed on the adhesive layer.

The film touch sensor may further comprise a base film on the insulation layer 50. In this case, the insulation layer 50 is adhered to the base film 100 by forming an additional adhesive layer 60 therebetween. The adhesive layer 60 may be formed from a pressure-sensitive adhesive or an adhesive, and any type of thermal curing or UV curing may be applicable.

The adhesive or pressure-sensitive adhesive used for attachment of the base film 100 is preferably polyester, polyether, polyurethane, epoxy, silicon or acrylic adhesive.

The film touch sensor according to another embodiment of the present invention will be described for its structure with reference to FIG. 8 below.

In the film touch sensor according to another embodiment of the present invention, a separation layer is formed on a carrier substrate prior to the formation procedures of the touch sensor and the film touch sensor is attached with a circuit board via an open area of an insulation layer before or after it is separated from the carrier substrate, thereby enhancing the efficiency of the procedures.

For this, as shown in FIG. 8, the film touch sensor comprises a separation layer; an electrode pattern layer formed on the separation layer and comprising a sensing electrode and a pad electrode formed at one end of the sensing electrode; an insulation layer formed on the sensing electrode so that the pad electrode is exposed; and a base film formed on the insulation layer.

The insulation layer 50 may be formed on the sensing electrode in the electrode pattern layer 40.

In order to provide a space that the pad electrode (PE) or the pad pattern layer 70 connects with the circuit board 110, the insulation layer 50 may be formed to cover only the sensing electrode (SE) without covering the pad electrode (PE) so that the pad electrode is exposed outside.

In the present invention, in order to form the insulation layer 50 so that the pad electrode (PE) is exposed, the insulation layer may be applied on the electrode pattern layer to cover the electrode pattern layer and then a part of the insulation layer may be removed by way of patterning, or the insulation layer may be applied on a region excluding the pad electrode region so that the pad electrode (PE) is exposed.

In the present invention, the insulation layer 50 fills a gap in the electrode or the wiring and it is preferably formed to have a certain thickness.

That is, for the attachment with the base film 100, the insulation layer is preferably planarized on the opposite surface of the surface in contact with the sensing electrode (SE) so that the uneven part of the electrode is not emerged.

The pad electrode (PE) is largely formed in the surrounding of the film touch sensor panel, and is electrically connecting with the sensing electrode (SE), and also it is the part that electrically connects with the circuit board 110.

As mentioned above, since the pad electrode (PE) is simultaneously formed together with the sensing electrode (SE) to compose the electrode pattern layer 40, the pad electrode may consist of a transparent conductive layer. Also, in order to more lower a resistance value, the pad pattern layer 70 may be formed with a material such as a metal or a metal oxide on the pad electrode (PE). Also, the pad pattern layer 70 can be omitted when a pad electrode is formed from a conductive material having a lower resistance, such as a metal.

The pad pattern layer 70 may be formed from at least one selected from the group consisting of a metal, a metal nanowire, a metal oxide, carbon nanotube, graphene, a conductive polymer and a conductive ink.

The pad pattern layer 70 may have a laminated structure consisting of two or more conductive layers.

Specifically, the pad pattern layer 70 may have a structure that a metal oxide is laminated and a metal is laminated on the metal oxide; a structure that a metal is laminated and a metal oxide is laminated on the metal; a structure that a metal is laminated, a metal oxide is laminated on the metal and a metal is further laminated on the metal oxide; or a structure that a metal oxide is laminated, a metal is laminated on the metal oxide and a metal oxide is further laminated on the metal.

The base film 100 is attached on the insulation layer 50 or on the adhesive layer 60.

The base film 100 is configured to be opened in the part that the pad electrode (PE) is formed so that the pad electrode (PE) is exposed, or it is configured to cover the pad electrode (PE). Similarly, in the case that the pad pattern layer 70 is formed on the pad electrode (PE), the base film 100 is configured to be opened in the part that the pad pattern layer is formed, or it is configured to cover the pad pattern layer 70.

The circuit board 110 may be a flexible printed circuit board (FPCB) and functions to electrically connect the film touch sensor of the present invention with a touch switch circuit.

The circuit board 110 has an electrode corresponding to the pad electrode at one end thereof, and the circuit board may electrically connect with the pad electrode in the opened region of the base film or the opened region of the insulation layer by a conductive adhesive. Also, the circuit board may connect with the pad electrode through the pad pattern layer 70, so as to lower the contact resistance between the pad electrode and the circuit board.

The connection of the circuit board and the pad electrode may be carried out through the pad pattern layer for the purpose of lowering contact resistance therebetween, and this may be selectively applied according to production process and product specifications.

Hereinafter, a method for preparing the above-mentioned film touch sensor according to the present invention will be described below.

FIGS. 5a to 5f schematically show the procedures for preparing a film touch sensor according to one embodiment of the present invention.

As shown in FIG. 5a, a carrier substrate 10 is coated with an organic polymer film to form a separation layer 20.

The formation of the separation layer may be carried out by a conventional coating method known in the art.

For example, spin coating, die coating, spray coating, roll coating, screen coating, slit coating, dip coating, gravure coating and the like may be mentioned.

After coating, the separation layer 20 is subject to curing by way of thermal curing or UV curing. These thermal curing and UV curing may be carried out alone or in combination thereof.

The carrier substrate 10 may be a glass, but is not limited thereto. That is, other kinds of substrate may be used as the carrier substrate 10 if they are heat-resistant materials that can endure a process temperature for electrode formation and maintain planarization without deformation at a high temperature.

As shown in FIG. 5b, an organic insulating film is applied on the separation layer 20 formed on the carrier substrate 10 to form a protective layer 30.

The protective layer 30 may be removed by way of patterning after its formation so as to form the pad pattern layer for connection of a circuit, or it may be formed by coating the organic insulating material excluding the region that the pad pattern layer will be formed. The pad pattern layer for connection of a circuit may be formed in the part that the protective layer is not formed. In this embodiment, it is described that the pad pattern layer is absent.

Next, an electrode pattern layer is formed on the protective layer 30. In this embodiment, it is described that the electrode pattern layer is laminated as a single layer.

As shown in FIG. 5*c*, a transparent electrode layer of ITO is first formed as a transparent conductive layer and a photosensitive resist (not shown) is formed thereon. Then, a photolithography procedure for selective patterning is carried out to form an electrode pattern layer 40, as shown in FIG. 5*d*.

The transparent conductive layer may be formed by a sputtering method, e.g., chemical vapor deposition (CVD), physical vapor deposition (PVD), plasma enhanced chemical vapor deposition (PECVD); a printing method, e.g., screen printing, gravure printing, reverse offset, ink jet; or a wetting or drying plating method. Particularly, the sputtering may be carried out on a mask disposed on a substrate to form an electrode pattern layer, the mask having the desired electrode pattern shape. After forming the conductive layer by the above-mentioned methods, electrode patterns may be formed by photolithography.

As the photosensitive resist, a negative-type photosensitive resist or a positive-type photosensitive resist may be used. If necessary, this resist may be remained on the electrode pattern layer 40. Alternatively, it may be removed. In this embodiment, it is described that a positive-type photosensitive resist is used and is removed on an electrode pattern after patterning.

Thereafter, an insulation layer 50 is formed to cover the electrode pattern layer 40, as shown in FIG. 5*e*. The insulation layer 50 may have the same thickness as the electrode or may be thicker than the electrode such that the insulation layer has a planarized upper surface. That is, the insulation layer is preferably formed from an insulating material having suitable viscoelasticity so that the uneven part of the electrode is not transferred.

Specifically, the formation of the insulation layer may be carried out by coating a liquid material thereof on the electrode pattern layer, followed by filming.

The coating for forming the insulation layer may be carried out by a conventional coating method known in the art.

For example, spin coating, die coating, spray coating, roll coating, screen coating, slit coating, dip coating, gravure coating and the like may be mentioned.

The filming of the insulation layer may be carried out by at least one method selected from thermal curing, UV curing, thermal drying and vacuum drying, which may be selected depending on the material characteristics of the insulation layer.

The insulation layer by itself may act as a supporter. In this case, an additional base film needs not to be attached since the insulation layer functions as a base film. If the top surface of the insulation layer is not planarized, the insulation layer fails to function as the base film due to its uneven part. When an additional base film is further attached on the insulation layer, it is difficult to allow uniform attachment, thereby deteriorating the performance of the touch sensor.

In the present invention, in order to provide a space that the pad electrode or the pad pattern layer connects with the circuit board, the insulation layer 50 may be formed to cover only the sensing electrode without covering the pad electrode so that the pad electrode is exposed outside.

In the formation of the insulation layer 50, in order for the pad electrode to be exposed, the insulation layer may be applied on the electrode pattern layer to cover the whole electrode pattern layer, followed by patterning, or the insulation layer may be applied on a region excluding the pad electrode region so that the pad electrode is exposed.

After forming the insulation layer, a pad pattern layer may be formed. In one embodiment of the present invention, it is described for the case that there is no pad pattern layer.

Then, as shown in 5*f*, the separation layer 20 on which the electrode is formed is separated from the carrier substrate 10.

In the present invention, the separation of the separation layer 20 from the carrier substrate 10 is carried out by peeling.

Examples of the peeling method may include lift-off and peel-off, without limitation.

For the peeling, a force of 1N/25 mm or less, preferably 0.1N/25 mm or less may be applied, and the force may be varied depending on the peeling strength of the separation layer. If the peeling strength exceeds 1N/25 mm, the film touch sensor may be broken during peeling from the carrier substrate and an excessive force may be applied to the film touch sensor, thereby causing the deformation of the film touch sensor and failing to function as a device.

Thereafter, the film touch sensor is attached with a circuit board, in which a conductive adhesive may be used for attachment with the circuit board.

The conductive adhesive refers to an adhesive having a conducting filler such as silver, copper, nickel, carbon, aluminum and gilded gold dispersed in a binder of epoxy, silicon, urethane, acrylic or polyimide resin.

The attachment of the circuit board may be carried out before or after the touch sensor is separated from the carrier substrate.

In the case that the circuit board is attached before the touch sensor is separated from the carrier substrate, a laminated structure may be formed so that a part of the pad electrode is exposed in at least one step among applying of the insulation layer, filming of the insulation layer and attaching of the base film or may be formed so that a part of the pad electrode is exposed by carrying out a separate patterning step, and then a circuit board is attached to the exposed pad electrode prior to the separation of the carrier substrate. When a pad pattern layer is formed on the pad electrode, the circuit board is attached to the pad pattern layer prior to separation of the carrier substrate.

In the case that the circuit board is attached after the touch sensor is separated from the carrier substrate, the circuit board may be attached with the pad electrode by passing through the separation layer at the direction of the separation layer. In this case, the circuit board connects with the pad electrode through the pad pattern layer formed on the bottom of the pad electrode. Also, the circuit board may be attached to the exposed pad electrode or pad pattern layer at the direction of the insulation layer or the base film.

The connection of the circuit board with the pad electrode through the pad pattern layer is carried out to lower contact resistance between the circuit board and the pad electrode and this may be selectively applied according to production process and product specifications.

FIGS. 6*a* to 6*b* schematically show procedures according to a second embodiment of the film touch sensor preparation method of the present invention.

The steps of forming the separation layer 20 on the carrier substrate 10, and a protective layer 30 thereon, and then forming the electrode pattern layer 40 and the insulation layer 50 are substantially identical to the case of the first embodiment.

In the second embodiment of the present invention, the base film 100 may be attached on the insulation layer 50. That is, it is characterized that the base film 100 is directly attached on the insulation layer 50 which comprises the function of an adhesive layer, as shown in FIG. 6a.

Such attachment of the base film on the insulation layer is carried out at a pressure of 1 to 200 Kg/cm$^2$, preferably 10 to 100 Kg/cm$^2$.

Thereafter, the separate layer is separated from the carrier substrate 10 by way of peeling, as shown in FIG. 6b. Then, the circuit board is attached to the pad electrode or the pad pattern layer.

FIGS. 7a to 7b schematically show procedures according to a third embodiment of the film touch sensor preparation method of the present invention.

In the third embodiment of the present invention, an adhesive layer 60 is formed on the formed insulation layer 50, followed by the attachment of the base film 100. In this case, the adhesive layer 60 may be pre-formed on one surface of the base film 100 prior to the attachment of the base film, in which a non-carrier film (NCF) type of adhesive or pressure-sensitive adhesive (PSA) film may be used. Alternatively, the adhesive layer may be formed by way of coating on the insulation layer and then the base film may be attached thereon. In this case, an optically clear resin (OCR) type of liquid adhesive is coated and then the base film to be attached is put thereon, followed by curing.

As shown in FIG. 7a, the base film is attached to the adhesive layer formed on the insulation layer in the laminated structure.

Thereafter, the separate layer is separated from the carrier substrate 10 by way of peeling, as shown in FIG. 7b. Then, the circuit board is attached to the pad electrode or the pad pattern layer.

FIGS. 9a to 9j schematically show procedures according to a fourth embodiment of the film touch sensor preparation method of the present invention.

As shown in FIG. 9a, the separation layer 20 is first formed by coating an organic polymer film on the carrier substrate 10.

As shown in FIG. 9b, the protective layer 30 is then formed by coating an organic insulating film on the separation layer 20.

Next, the electrode pattern layer is formed on the protective layer 30. In this embodiment, it is described that the electrode pattern layer is a laminate of two layers.

A first electrode layer 41 is first formed as a transparent electrode layer of ITO as shown in FIG. 9c, and a second electrode layer 42 of AgNW is formed thereon as shown in FIG. 9d.

As shown in FIG. 9e, the electrode pattern layer 40 of the first electrode layer 41 and the second electrode layer 42 thus formed are simultaneously subject to selective patterning to form electrode patterns.

Next, as shown in FIG. 9f, the insulation layer 50 is formed to cover only the sensing electrode (SE) so that the part of the pad electrode (PE) is exposed. The thickness of the insulation layer 50 is equivalent to or thicker than that of the electrode, by which the top surface of the insulation layer is planarized. That is, the insulation layer is formed from an insulating material having suitable viscoelasticity so that the uneven part of the electrode is not transferred.

If the top surface of the insulation layer is not planarized, a defect may occur on the attachment of the base film 100.

In this case, as shown in FIG. 9g, after forming the insulation layer 50 to cover the whole electrode including the pad electrode (PE), the insulation layer may be partially treated by way of selective removal for only the part on the pad electrode so that the pad electrode (PE) is exposed.

Then, as shown in FIG. 9h, the pad pattern layer 70 is formed with a metal or other conductive material on the top of the pad electrode (PE) in which the insulation layer 50 is not formed. In this case, the pad pattern layer 70 may have a laminated structure of a first pad pattern layer 71 and a second pad pattern layer 72. For example, it is preferred that the first pad pattern layer 71 is made of cupper, and the second pad pattern layer 72 is made of a material having conductivity better than electrode materials, such as gold.

Subsequently, the base film 100 having an adhesive layer 60 formed on one surface thereof is attached on the insulation layer 50.

In this case, the adhesive layer 60 is pre-formed on the insulation layer 50 prior to attachment of the base film 100.

The adhesive layer 60 may be formed by coating a pressure-sensitive adhesive or an adhesive on the top of the insulation layer or one surface of the base film, or by attaching a non-carrier film (NCF) type of adhesive or pressure-sensitive adhesive film thereon.

Similar to the insulation layer 50, the base film 100 may be configured to be opened in the part that the pad pattern layer 70 is formed so that the pad pattern layer 70 is exposed.

Meanwhile, in the case that the base film 100 is attached after the attachment of the circuit board to the pad pattern layer, the base film may be configured to cover the pad pattern layer.

Then, as shown in FIG. 9i, the circuit board 110 is attached to the pad pattern layer 70 via an open area of the base film 100. The attachment of the circuit board 110 may be carried out using a conductive adhesive.

The conductive adhesive refers to an adhesive having a conducting filler such as silver, copper, nickel, carbon, aluminum and gilded gold dispersed in a binder of epoxy, silicon, urethane or polyimide resin.

By such procedures, the circuit board 110 electrically connects with the pad pattern layer 70.

For next procedure for preparing the touch sensor, as shown in FIG. 9j, the separation layer 20 having an electrode formed thereon is separated from the carrier substrate 10.

In the present invention, the separation of the separate layer 20 from the carrier substrate 10 is carried out by way of peeling.

Although the peeling force may be varied depending on the peeling strength of the separation layer, a peeling strength of 1N/25 mm or less is preferably applied.

FIGS. 10a to 10c schematically show procedures according to a fifth embodiment of the film touch sensor preparation method of the present invention.

The steps of forming the separation layer 20 on the carrier substrate 10, and a protective layer 30 thereon, and then forming the insulation layer 50 and the pad pattern layer 70 are substantially identical to the case of the fourth embodiment.

In the fifth embodiment of the present invention, the electrical connection of the pad pattern layer 70 and the circuit board 110 is first carried out prior to attachment of the base film 100.

Thereafter, the base film 100 is attached through the adhesive layer 60.

In another embodiment of the present invention, the separation layer 20 having the electrode and the base film attached thereto is separated from the carrier substrate 10 prior to attachment of the circuit board 110. Then, after separation, the circuit board 110 is attached to the pad pattern layer 70 via an open area of the base film 100 for electrical connection therebetween.

Although not being shown in the above embodiments of the present invention, the lamination sequence of each layer in the touch sensor may be varied.

The film touch sensor prepared by the present invention can be used so that its base film is disposed in a visible side on attachment to a display panel or its base film is disposed in the side of the display panel. Also, its separation layer may be attached to other optical films, such as a polarizing plate and a transparent film.

The film touch sensor and the preparation method thereof according to the present invention can provide high definition and heat resistance since it is implemented on a carrier substrate, which has been impossible in the case of a conventional touch sensor that has been directly formed on a base film, and can apply various base films. That is, a base film with weak heat resistance can be used since it is attached after formation of an electrode.

Also, a circuit board can be attached to the pad pattern layer before or after the separation layer is separated from the carrier substrate without the removal of the separation layer, enhancing the efficiency of procedures.

In addition, an elasticity-controlled protective layer is further formed between the separation layer and the insulation layer to inhibit crack generation due to a difference of stress-relieving capability in each layer and to prevent curl generation in the film touch sensor.

Although particular embodiments of the present invention have been shown and described, it will be understood by those skilled in the art that it is not intended to limit the present invention to the preferred embodiments, and it will be obvious to those skilled in the art that various changes and modifications may be made without departing from the spirit and scope of the invention.

The scope of the present invention, therefore, is to be defined by the appended claims and equivalents thereof.

[Description of reference numerals]

| | |
|---|---|
| 10: Carrier Substrate | 20: Separation Layer |
| 30: Protective Layer | 40: Electrode Pattern Layer |
| 41: First Electrode Layer | 42: Second Electrode Layer |
| 50: Insulation Layer | 60: Adhesive Layer |
| 70: Pad Pattern Layer | 71: First Pad Pattern Layer |
| 72: Second Pad Pattern Layer | 100: Base Film |
| 110: Circuit Board | SE: Sensing Electrode |
| PE: Pad Electrode | |

The invention claimed is:

1. A method for preparing a film touch sensor, comprising the steps of:
    applying a separation layer on a carrier substrate without any additional layer therebetween;
    curing the separation layer;
    forming an electrode pattern layer comprising a sensing electrode and a pad electrode on the separation layer;
    applying an insulation layer on the electrode pattern layer;
    bringing the insulation layer into filming;
    forming a pad pattern layer on the pad electrode; and
    removing the carrier substrate by separating the separation layer from the carrier substrate by way of lift-off or peel-off only with a physical force of 1N/25 mm or less without any additional step to reduce peeling strength of the separation layer;
    wherein the pad electrode electrically connects with a circuit board through the pad pattern layer; and
    wherein the pad electrode and the pad pattern layer are disposed at a location where the circuit board is attached.

2. The method for preparing a film touch sensor according to claim 1, which further comprises the step of forming a protective layer on the separation layer after the curing of the separation layer,
    wherein the formation of the electrode pattern layer is carried out on the protective layer.

3. The method for preparing a film touch sensor according to claim 2, which further comprises the step of removing a part of the protective layer corresponding to a region that the pad electrode is formed so that the separation layer is exposed, after the formation of the protective layer.

4. The method for preparing a film touch sensor according to claim 1, which further comprises the step of removing a part of the insulation layer that connects with a circuit board, after the filming of the insulation layer.

5. The method for preparing a film touch sensor according to claim 1, wherein the curing of the separation layer is carried out by at least one method selected from thermal curing and UV curing.

6. The method for preparing a film touch sensor according to claim 1, wherein the filming of the insulation layer is carried out by at least one method selected from thermal curing, UV curing, thermal drying and vacuum drying.

7. The method for preparing a film touch sensor according to claim 1, which further comprises the step of attaching a base film to the insulation layer.

8. The method for preparing a film touch sensor according to claim 7, wherein the attachment of the base film is carried out by direct adhesion between the base film and the insulation layer.

9. The method for preparing a film touch sensor according to claim 7, wherein the attachment of the base film is carried out by adhesion between the base film and the insulation layer with an adhesive.

10. The method for preparing a film touch sensor according to claim 7, wherein the attachment of the base film is carried out by adhesion between the base film and the insulation layer with a pressure-sensitive adhesive.

11. The method for preparing a film touch sensor according to claim 7, which further comprises the step of:
    attaching a circuit board to the pad pattern layer, after the attachment of the base film; and
    wherein the removal of the carrier substrate is carried out after the attachment of the circuit board.

12. The method for preparing a film touch sensor according to claim 11, wherein the removal of the carrier substrate is carried out by separating the separation layer from the carrier substrate with a force of 0.1N/25 mm or less.

13. The method for preparing a film touch sensor according to claim 7,
    wherein the removal of the carrier substrate is carried out after the attachment of the base film; and
    wherein the method further comprises the step of attaching a circuit board to the pad pattern layer, after the removal of the carrier substrate.

14. The method for preparing a film touch sensor according to claim 1, wherein the applying of the insulation layer is carried out by forming the insulation layer to cover only the sensing electrode so that the pad electrode is exposed.

15. The method for preparing a film touch sensor according to claim 1, which further comprises the step of attaching a circuit board to the pad pattern layer, after the filming of the insulation layer.

16. The method for preparing a film touch sensor according to claim 15, which further comprises the step of:
attaching a base film to the insulation layer,
wherein the removing of the carrier substrate is carried out after the attachment of the circuit board.

17. The method for preparing a film touch sensor according to claim 1, which further comprises the steps of:
attaching a circuit board to the pad pattern layer, wherein the removal of the carrier substrate is carried out after the filming of the insulation layer.

18. The method for preparing a film touch sensor according to claim 1, wherein the formation of the electrode pattern layer comprises forming a first electrode layer with a transparent conductive layer and bringing the first electrode layer into patterning.

19. The method for preparing a film touch sensor according to claim 18, wherein the formation of the electrode pattern layer further comprises forming a second electrode layer with a metal nanowire or a metal on the first electrode layer, after the formation of the first electrode layer.

20. The method for preparing a film touch sensor according to claim 19, wherein the first electrode layer and the second electrode layer are simultaneously subject to patterning.

21. The method for preparing a film touch sensor according to claim 1, wherein the formation of the electrode pattern layer further comprises forming a bridge electrode.

22. The method for preparing a film touch sensor according to claim 1, wherein the formation of the pad pattern layer comprises a first step of forming a metallic conductive layer on the pad electrode, and a second step of bringing the metallic conductive layer into patterning.

23. A method for preparing a film touch sensor, comprising the steps of:
forming a separation layer on a carrier substrate without any additional layer therebetween;
forming an electrode pattern layer comprising a sensing electrode and a pad electrode on the separation layer;
forming an insulation layer on the electrode pattern layer;
removing a part of the insulation layer, the part being formed on the pad electrode;
forming a pad pattern layer on the pad electrode;
attaching a base film to the insulation layer; and
removing the carrier substrate by separating the separation layer from the carrier substrate by way of lift-off or peel-off only with a physical force of 1N/25 mm or less without any additional step to reduce peeling strength of the separation layer;
wherein the pad electrode electrically connects with a circuit board through the pad pattern layer; and
wherein the pad electrode and the pad pattern layer are disposed at a location where the circuit board is attached.

* * * * *